United States Patent
Kanbe

(10) Patent No.: US 8,614,758 B2
(45) Date of Patent: *Dec. 24, 2013

(54) SOLID-STATE IMAGING DEVICE, METHOD FOR MANUFACTURING THE SAME, METHOD FOR DRIVING THE SAME, AND ELECTRONIC APPARATUS

(75) Inventor: Hideo Kanbe, Kanagawa (JP)

(73) Assignee: Sony Corporation, Tokyo (JP)

(*) Notice: Subject to any disclaimer, the term of this patent is extended or adjusted under 35 U.S.C. 154(b) by 1002 days.

This patent is subject to a terminal disclaimer.

(21) Appl. No.: 12/695,316

(22) Filed: Jan. 28, 2010

(65) Prior Publication Data

US 2010/0194959 A1 Aug. 5, 2010

(30) Foreign Application Priority Data

Feb. 5, 2009 (JP) .................................. 2009-025346

(51) Int. Cl.
*H04N 5/335* (2011.01)

(52) U.S. Cl.
USPC ............ 348/311; 348/294; 348/296; 348/297

(58) Field of Classification Search
USPC .............. 348/296, 297, 294, 257, 208.1, 308, 348/311
See application file for complete search history.

(56) References Cited

U.S. PATENT DOCUMENTS

| 8,253,835 B2* | 8/2012 | Egawa et al. .................. 348/308 |
| 8,294,801 B2* | 10/2012 | Ito et al. ......................... 348/311 |
| 2007/0023785 A1* | 2/2007 | Hasuka et al. ................ 257/215 |

FOREIGN PATENT DOCUMENTS

| JP | 02-243073 | 9/1990 |
| JP | 07-336604 | 12/1995 |

* cited by examiner

*Primary Examiner* — James M Hannett
*Assistant Examiner* — Quang Le
(74) *Attorney, Agent, or Firm* — Dentons US LLP

(57) ABSTRACT

A solid-state imaging device including: a substrate; a substrate voltage supply that applies a first potential to the substrate during a light receiving period and applies a second potential to the substrate during a no-light receiving period; and a plurality of pixels including a light receiving portion that generates signal charges in response to received light, a storage capacitor that stores and holds the signal charges, a dark current suppressing portion, an electronic shutter adjusting layer that adjusts potential distribution in a substrate so that the signal charges are swept to the rear surface side of the substrate, a readout gate portion that reads out the signal charges stored in the storage capacitor, and a vertical transfer register that transfers the signal charges read out by the readout gate portion in a vertical direction.

13 Claims, 8 Drawing Sheets

SOLID-STATE IMAGING DEVICE, METHOD FOR MANUFACTURING THE SAME, METHOD FOR DRIVING THE SAME, AND ELECTRONIC APPARATUS

BACKGROUND OF THE INVENTION

1. Field of the Invention

The present invention relates to a solid-state imaging device, and particularly, to a charge coupled device (CCD) solid-state imaging device (hereinafter referred to as a CCD imaging device), a method for manufacturing the solid-state imaging device, and a method for driving the solid-state imaging device. In addition, the invention relates to electronic apparatus using the solid-state imaging device.

2. Description of the Related Art

It is preferable that a solid-state imaging device, which is used in a digital camera module for a small-sized mobile apparatus such as a mobile phone, has a configuration appropriate for a digital camera module without a mechanical shutter.

In a progressive scan CCD imaging device, signal charges stored in a light receiving portion in all pixels are transferred to a light-shielded vertical CCD to read out one frame only with one readout operation (Japanese Unexamined Patent Application Publication No. 07-336604). On the other hand, in an interlaced scan CCD imaging device, signal charges stored in a light receiving portion of each pixel are read out in alternative manner using a vertical CCD (Japanese Unexamined Patent Application Publication No. 02-243073). In this case, signal charges, which are successively generated by photoelectric conversion in the light receiving portion of each pixel during the readout time, are inevitably added to signal charges of interest.

For that reason, in order to realize digital cameras without a mechanical shutter, it is necessary to use progressive scan CCD as a solid-state imaging device.

However, since the progressive scan CCD imaging device is necessary to have a 1-bit transferring stage of the vertical CCD for each light receiving portion, the structure of a transfer electrode in the vertical CCD becomes complicated and the amount of signal charges transferred each time in the vertical CCD is easily restricted. To the contrary, if it is assumed that the mechanical shutter is used, it is possible for the interlaced scan CCD imaging device to transfer the signal charges plural times, and therefore generally a large amount of charges generally can be treated.

On the other hand, when a CMOS type solid-state imaging device (hereinafter referred to as a CMOS imaging device) is used for a digital camera module, it is possible to perform line-ordered light reception in a light receiving portion and line-ordered readout by a transferring transistor. For this reason, it is possible to lower the influence of light successively incident on the light receiving portion by reading out signal charges in the line order in the light receiving portion as soon as a light receiving period ends.

As described above, since the signal charges are read out in the line order in the CMOS imaging device, for example, an upper line and a lower line in a screen have different light receiving time zones (timing of light receiving). If the number of pixel is large, it inevitably takes a long time to read out all screens. However, when a moving object is photographed, a blurred picture will be obtained because each line of pixels of a CMOS imaging device has different information which are captured in a different timing.

For the reasons described above, cameras mounted in mobile phones at present use the CMOS imaging device, but differences in light receiving time zones are prevented by mounting a mechanical shutter thereto. In other words, a light receiving portion in a CMOS imaging device performs the generation and accumulation of signal charges for a certain period of time when the mechanical shutter is opened, and the signal charges are read out from each light receiving portion in the line order after the mechanical shutter is closed.

As above, the Progressive scan CCD imaging device has a problem that the structure of an electrode in the CCD becomes complicated, and the CMOS imaging device has a problem that the device has to use a mechanical shutter in order to prevent differences in the light receiving time zones.

SUMMARY OF THE INVENTION

It is desirable to provide a CCD imaging device that can be used in electronic apparatus without a shutter outside of the body such as a mechanical shutter, a manufacturing method of the solid-state imaging device, and a driving method of the solid-state imaging device. In addition, it is desirable to provide electronic apparatus using the solid-state imaging device.

According to an embodiment of the present invention, a solid-state imaging device includes a substrate, a substrate voltage supply that applies different potential to the substrate during a light receiving period and a no-light receiving period. Furthermore, the substrate is formed with a plurality of pixels including a light receiving portion, a storage capacitor, a dark current suppressing portion, a readout gate portion, and a vertical transfer register.

The light receiving portion is formed on a surface of the substrate, and generates signal charges in response to received light. The storage capacitor is formed in a region adjacent to the light receiving portion and transfers the signal charges generated in the light receiving portion when a first potential is applied to the substrate, and stores and holds the signal charges.

The dark current suppressing portion is formed on the light receiving portion and the storage capacitor.

An electronic shutter adjusting layer is formed in a region facing the light receiving portion in the substrate and set apart from the storage capacitor as far as a predetermined offset region. In addition, the electronic shutter adjusting layer adjusts potential distribution in the substrate so that signal charges generated in the light receiving portion when a second potential is applied to the substrate are swept to the rear surface side of the substrate.

The readout gate portion reads out signal charges stored in the storage capacitor.

The vertical transfer register transfers the signal charges read out by the readout gate portion in the vertical direction.

According to another embodiment of the present invention, a manufacturing method of a solid-state imaging device includes the steps of preparing a first conductivity type semiconductor substrate and forming a second conductivity type semiconductor well layer on the semiconductor substrate, forming on the surface of the semiconductor well layer a light receiving portion, a storage capacitor adjacent to the light receiving portion, and a vertical transfer channel adjacent to the storage capacitor via a readout gate portion interposed therebetween, forming an electronic shutter adjusting layer of a first conductivity type in a region between the semiconductor substrate and the semiconductor well layer, facing the light receiving portion, and set apart from the storage capacitor as far as a predetermined offset region before or after the formation of the semiconductor well layer, forming a dark current suppressing portion on the storage capacitor and the light receiving portion in the light incidence side, and connecting to the substrate a substrate voltage supply that applies different potential during a light receiving period and no-light receiving period.

According to still another embodiment of the present invention, a driving method of a solid-state imaging device includes the steps of initiating transferring of the signal charges generated in the light receiving portion to the storage capacitor with the application of the first potential by the substrate voltage supply to the substrate, and terminating transferring of signal charges generated in the light receiving portion to the storage capacitor with the application of the second potential by the substrate voltage supply to the semiconductor substrate, and then sweeping the signal charge generated in the light receiving portion to the substrate side.

In the driving method of the solid-state imaging device according to the above embodiment of the present invention, the signal charges are not stored in the light receiving portion, but transferred to the storage capacitor at any time or swept to the substrate side. In addition, by changing substrate voltage, the signal charges generated in the light receiving portion are uninterruptedly transferred to the storage capacitor and swept to the substrate side.

According to the embodiments of the present invention, electronic apparatus includes an optical lens, a solid-state imaging device, and a signal processing circuit. The solid-state imaging device according to the above embodiment of the invention is applied to such electronic apparatus of the embodiment of the invention.

According to the above embodiments of the present invention, it is possible to obtain a solid-state imaging device that employs non-progressive scan method and can be applied to electronic apparatus without a shutter outside of the body such as a mechanical shutter. With the configuration, it is possible to obtain electronic apparatus that is inexpensive, small-sized, and light-weighted.

DESCRIPTION OF THE PREFERRED EMBODIMENTS

Hereinafter, a solid-state imaging device, a manufacturing method thereof, a driving method thereof, and an example of electronic apparatus according to the embodiments of the present invention will be described with reference to FIGS. 1 to 9. The embodiments of the present invention will be described in the following order. In addition, the present invention is not limited to the examples given below.

1. First Embodiment: Example of Solid-state Imaging Device 1.1 The configuration of the solid-state imaging device 1.2 The cross-sectional configuration of the solid-state imaging device 1.3 The manufacturing method of the solid-state imaging device 1.4 The driving method of the solid-state imaging device 2. Second Embodiment: Example of Solid-state Imaging Device 3. Third Embodiment: Example of Electronic Apparatus <1. First Embodiment>

[1.1 The Configuration of the Solid-State Imaging Device]

Figure 1:
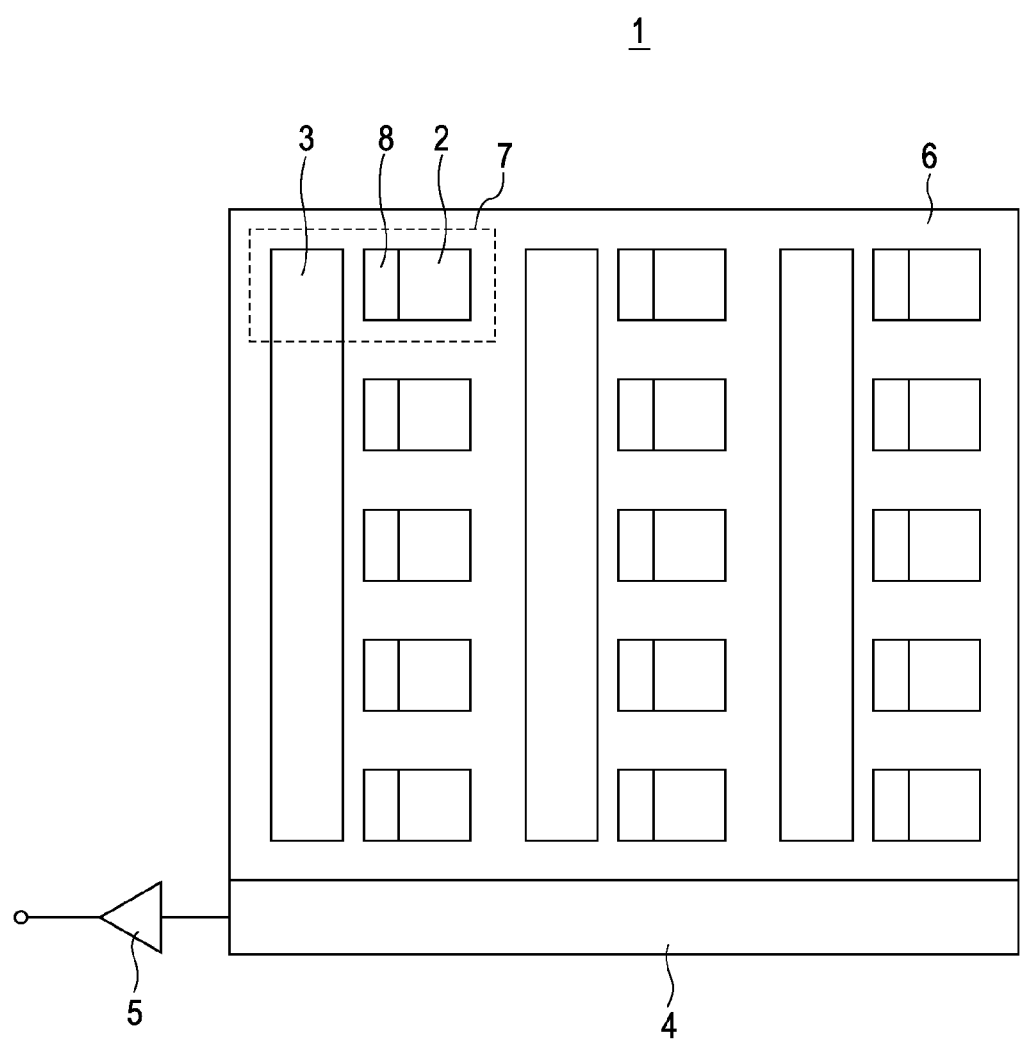
FIG. 1 is a schematic diagram illustrating a configuration of a solid-state imaging device according to a first embodiment of the present invention.

FIG. 1 shows a schematic diagram illustrating a CCD imaging device according to the first embodiment of the present invention. As shown in FIG. 1, a solid-state imaging device 1 of the present embodiment includes a plurality of light receiving portions 2 formed on a substrate 6, storage capacitors 8 formed adjacent to each of the light receiving portions 2, vertical transfer registers 3, a horizontal transfer register 4 and an output circuit 5. A unit pixel 7 includes one light receiving portion 2, one storage capacitor 8, and the vertical transfer register 3 adjacent to the storage capacitor 8. The transferring scheme of the solid-state imaging device 1 of the present embodiment is the interline transfer (IT) scheme in which a transferring portion including the light receiving portion 2 and the vertical transfer register 3 is divided, and the interlaced scan performs sequential readout for each line. The interlaced scan scheme includes the thinning readout or the multiple interlaced readout such as 1:3, 1:4, and 1:5.

The light receiving portion 2 includes a photoelectric transducer, that is, a photodiode, and generates signal charges. In the present embodiment, the plurality light receiving portions 2 are formed on the substrate 6 in a matrix form in the horizontal and vertical direction.

The storage capacitors 8 are formed adjacent to each of the light receiving portions 2 and store the signal charges generated in each of the light receiving portions 2.

The plurality of vertical transfer registers 3 have CCD structure, and are formed in the vertical direction for each of the light receiving portions 2 and the storage capacitors 8 that are arranged in the vertical direction. The vertical transfer register 3 reads out the signal charges stored in the storage capacitor 8 in order to transfer the signal charges in the vertical direction. The transferring stage in which the vertical transfer register 3 is formed in the present embodiment, for example, employs 4-phase driving by a transfer driving pulse applied from a transfer driving pulse circuit (not shown). In addition, in the final stage of the vertical transfer register 3, signal charges held in the final stage are transferred to the horizontal transfer register 4 with the application of the transfer driving pulse.

The horizontal transfer register 4 is formed at one end of the final stage of the vertical transfer register 3 employing the CCD structure. In the transferring stage in which the horizontal transfer register 4 is formed, the signal charges vertically transferred by the vertical transfer register 3 are transferred for one horizontal line in the horizontal direction.

The output circuit 5 outputs the signal charges horizontally transferred by the horizontal transfer register 4 as video signals by charge-voltage conversion.

In the solid-state imaging device 1 with the above configuration, the signal charges stored in the light receiving portion 2 are transferred in the vertical direction by the vertical transfer register 3 and then transferred into the horizontal transfer register 4. Moreover, each of the signal charges transferred into the horizontal transfer register 4 is transferred in the horizontal direction and output as video signals through the output circuit 5.

[1.2 The Cross-Sectional Configuration of the Solid-State Imaging Device]

Figure 2:
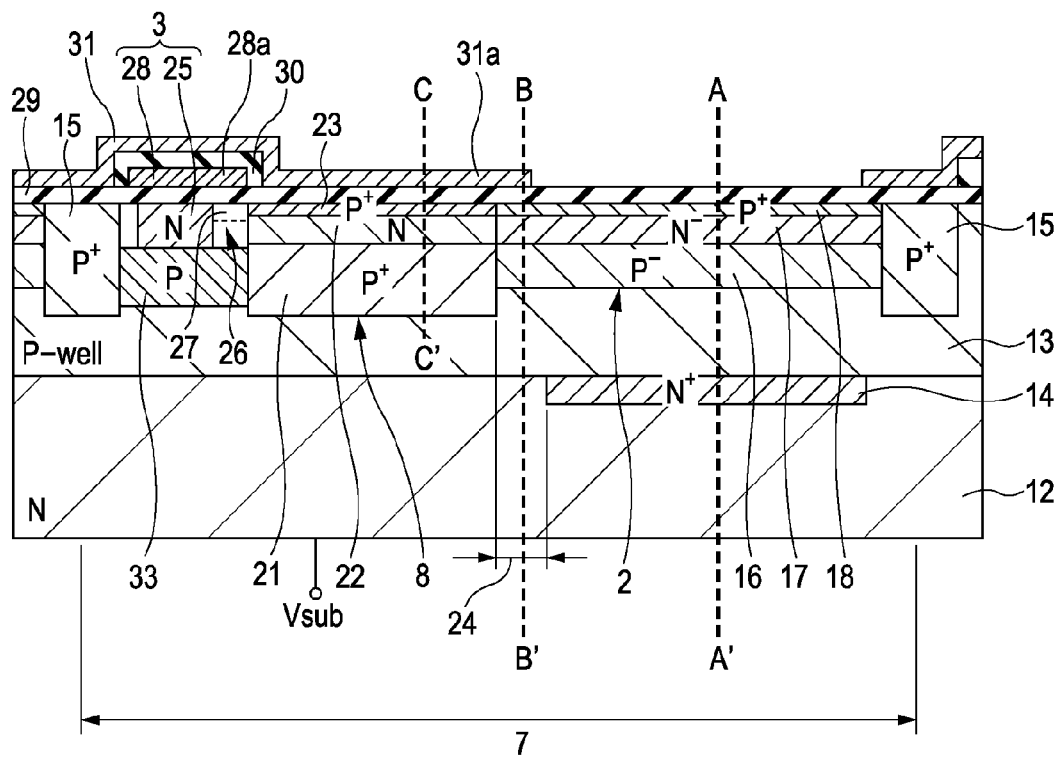
FIG. 2 is a schematic cross-sectional diagram illustrating the structure of the solid-state imaging device according to the first embodiment of the present invention.

FIG. 2 is a schematic diagram illustrating the structure of one pixel in the solid-state imaging device 1 according to the present embodiment. In the embodiment, the present invention will be explained by assuming a first conductivity type to be N-type and a second conductivity type to be P-type.

The solid-state imaging device 1 of the present embodiment includes a semiconductor substrate 12, a semiconductor well layer 13, and a substrate voltage supply (not shown). The semiconductor well layer 13 is formed with the light receiving portion 2, the storage capacitor 8, a readout gate portion 26, the vertical transfer register 3, an electronic shutter adjusting layer 14, and a first and a second dark current suppressing portions 18 and 23 constituting a pixel 7.

The semiconductor substrate 12 is constituted with an N-type CZ substrate formed of, for example, silicon. The substrate voltage supply applies different substrate voltage Vsub to the semiconductor substrate 12 during a light receiving period in the light receiving portion 2 and a period of reading out signal charges from the storage capacitor 8 to the vertical transfer register 3 and transferring the signal charges by the vertical transfer register 3. The substrate voltage supply may be provided outside the device, and provided within the solid-state imaging device 1 as a substrate voltage generating circuit.

The semiconductor well layer 13 is constituted with a P⁻-type epitaxial layer formed above the semiconductor substrate 12. In the present embodiment, a surface of the semiconductor well layer 13, which is opposed to the surface facing the semiconductor substrate 12, is a light receiving face.

The light receiving portion 2 is constituted with the first dark current suppressing portion 18, a N-type lightly-doped region (N⁻-type) 17, and a P-type lightly-doped region (P-type) 16. The N⁻ region 17 is formed in the light receiving face side of the semiconductor well layer 13. The P-region 16 is formed in the opposite side of the light receiving face with respect to the N⁻ region 17 so as to come into contact with the N⁻ region. In other words, the light receiving portion 2 of the present embodiment is formed of a photodiode including a junction plane between the N⁻ region 17 and the P-region 16. In the light receiving portion 2, light incident from the light receiving face is subjected to photoelectric conversion by the junction plane and signal charges are generated in response to the amount of light.

The storage capacitor 8 is constituted with an N-type impurity region (N region) 22 and a P-type heavily-doped region (P⁺ region) 21, and formed adjacent to the light receiving portion 2 formed on the semiconductor well layer 13. The N region 22 is formed in a region which is the light receiving face side of the semiconductor well layer 13 and is adjacent to the N⁻ region 17 constituting the light receiving portion 2 in the horizontal direction. The P⁺ region 21 is formed in the opposite side of the light receiving face with respect to the N region 22 so as to come into contact with the N region 22. In other words, a well of potential is generated by the junction plane between the N region 22 and the P⁺ region 21, and signal charges generated in the light receiving portion 2 are stored in the N region 22. Here, the electrostatic potential of the storage capacitor 8 is configured to be deeper than the electrostatic potential of the light receiving portion 2.

The first dark current suppressing portion 18 is formed the outermost surface in the light receiving face side of the light receiving portion 2 formed on the substrate well layer 13. The second dark current suppressing portion 23 is formed the outermost surface in the light receiving face side of the storage capacitor 8. The first and second dark current suppressing portions 18 and 23 are constituted with P-type heavily-doped region, and integrally formed spanning from the light receiving portion 2 to the storage capacitor 8. In the first and second dark current suppressing portions 18 and 23, dark current generated at the interface of the light receiving face is reduced in the presence of holes, which are majority carriers, in the P-type heavily-doped region. In other words, in the light receiving portion 2 and the storage capacitor 8 of the present embodiment, the structure of the Hole-Accumulation Diode (HAD: a registered trademark), so-called an embedded photodiode is provided.

The electronic shutter adjusting layer 14 is formed in a region facing the light receiving portion 2 in a surface side that the semiconductor substrate 12 faces the semiconductor well layer 13 with N-type heavily-doped region. Furthermore, the electronic shutter adjusting layer 14 is formed to be set apart as far as a predetermined offset region 24 in the horizontal direction from the region where the storage capacitor 8 is formed to the light receiving portion 2 side. The offset region 24 is determined such that potential distribution of the semiconductor substrate 12 and the semiconductor well layer 13 is optimized as described later.

The readout gate portion 26 is constituted with a readout channel 27 and a readout electrode 28a. The readout channel 27 is formed in a region adjacent to the storage capacitor 8 formed on the surface of the semiconductor well layer 13 with the P-type or N-type lightly-doped region. In addition, the readout electrode 28a is formed above the readout channel 27 via a gate insulating film 29 interposed therebetween.

The vertical transfer register 3 is constituted with a vertical transfer channel 25 and a vertical transfer electrode 28. The vertical transfer channel 25 is formed in a region adjacent to the readout channel 27 with N-type doped region. Below the vertical transfer channel 25, a transferring portion semiconductor well layer 33 is formed with the P-type impurity region.

The vertical transfer electrode 28 is formed above the vertical transfer channel 25 formed above the semiconductor well layer 13 via the gate insulating film 29 interposed therebetween. Despite not showing in the drawing, a plurality of vertical transfer electrodes 28 are formed in the horizontal direction, and serve as a readout electrode 28a in a portion adjacent to the storage capacitor 8. In the vertical transfer register 3, signal charges read out by the readout gate portion 26 in the vertical transfer channel 25 are transferred in the vertical direction in order to the plurality of vertical transfer electrode 28 formed in the horizontal direction by, for example, the application of 4-phase vertically transferring pulse.

In the present embodiment, the gate insulating film 29 is formed over the semiconductor well layer 13. In a region surrounding the light receiving portion 2, the storage capacitor 8, and the vertical transfer register 3 that constitute the pixel 7, a channel stop portion 15 is formed with the P-type heavily-doped region separating adjacent pixels.

The light shielding layer 31 is formed so as to cover the surface above the semiconductor well layer 13 including electrodes such as the vertical transfer electrode 28 except for an opening region of the light receiving portion 2 via the interlayer insulating film 30 interposed. In this case, the end of the light shielding layer 31 above the storage capacitor 8 is formed so as to have a protruding portion 31a that extends as far as a predetermined region in the light receiving portion 2 side.

Next, potential profile of the solid-state imaging device 1 according to the present embodiment will be explained with reference to FIG. 3. In the explanation below, the semiconductor substrate 12 and the semiconductor well layer 13 is generally referred to as a "substrate" in the case where the two components are described without distinction.

Figure 3:
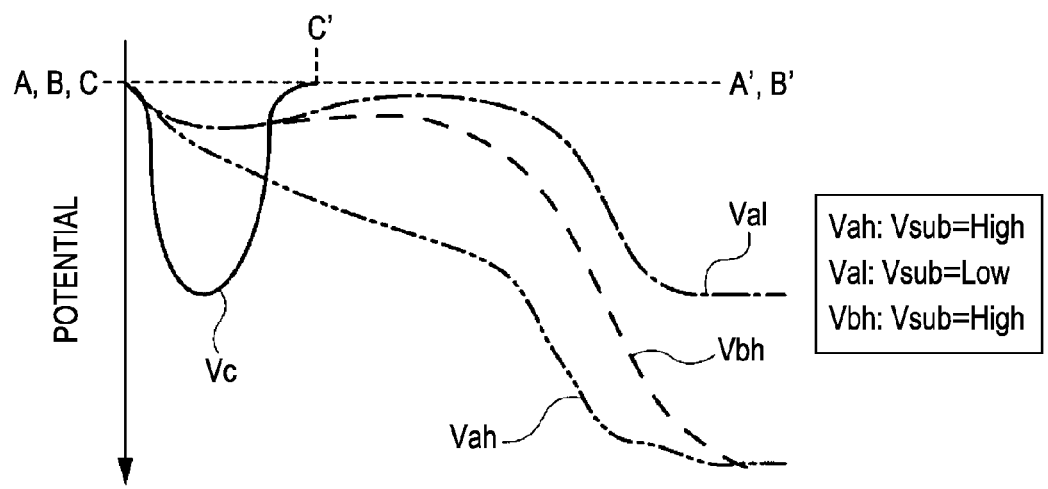
FIG. 3 is a graph illustrating potential of a substrate in the solid-state imaging device according to the first embodiment of the present invention.

FIG. 3 is a potential distribution diagram illustrating potential on the substrate along the lines A-A', B-B', and C-C' in FIG. 2. The line A-A' is the potential distribution that includes the light receiving portion 2 and the electronic shutter adjusting layer 14 of the substrate in the vertical direction, and the line B-B' is the potential distribution that includes the light receiving portion 2 and the offset region 24 of the substrate in the vertical direction. In addition, the line C-C' is the potential distribution that includes the storage capacitor 8 of the substrate in the vertical direction.

The one-dotted chain line shown in FIG. 3 represents the voltage Val along the line A-A' when the substrate voltage Vsub is set to a first voltage (hereinafter, low). The two-dotted chain line shown in FIG. 3 represents the voltage Vah along the line A-A' when the substrate voltage Vsub is set to a second voltage (hereinafter, high) that is higher than the first voltage. In addition, the dashed line shown in FIG. 3 represents the voltage Vbh along the line B-B' when the substrate voltage Vsub is set to be high. The solid line shown in FIG. 3 represents the voltage Vc along the line C-C'.

As shown in FIG. 3, when the substrate voltage Vsub is set to be low, the voltage Val along the line A-A' is configured such that the potential in the $N^-$ region 17 constituting the light receiving portion 2 is deeper than the potential in $P^-$ region 16 or the semiconductor well layer 13. In other words, the well having a shallow potential is formed in $N^-$ region 17 of the light receiving portion 2. The impurity concentration of the $N^-$ region 17 is set to have potential shallower by about 1 V than that of the light receiving portion having the HAD structure that has been typically used.

Furthermore, when the substrate voltage Vsub is low, the potential of the substrate along the line B-B' becomes the same manner as the potential Val along the line A-A' (not shown).

Next, when the substrate voltage Vsub is set to be high, the potential Vah along the line A-A' is pulled over all due to the influence of the electronic shutter adjusting layer 14 formed of the N-type heavily-doped region. Moreover, the potential Vah is changed so as to be deeper in the semiconductor substrate 12 side. In addition, since the electronic shutter adjusting layer 14 is not formed on the line B-B' due to the offset region 24, the potential Vbh around the light receiving portion 2 maintains substantially the same value as the substrate voltage Vsub is low only with a little deeper potential in the semiconductor substrate 12 side.

Furthermore, the potential Vc along the line C-C' is configured so as to have a well of the potential deeper than that of the light receiving portion 2 due to the influence of the junction plane between N region 22 constituting the storage capacitor 8 and the $P^+$ region 21 with relatively heavy impurity concentration.

[1.3 The Manufacturing Method of the Solid-State Imaging Device]

The manufacturing method of the solid-state imaging device having the above configuration will be described with reference to FIGS. 4A to 4C and FIGS. 5D and 5E. Components in FIGS. 4A to 4C corresponding to those in FIG. 2 are given the same reference numerals and overlapping description thereof will not be repeated.

Figure 4A:
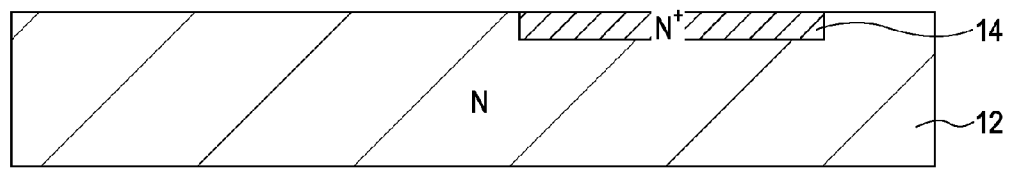
FIGS. 4A to 4C are diagrams illustrating a manufacturing process of the solid-state imaging device according to the first embodiment of the present invention (the first part)

As shown in FIG. 4A, the N-type semiconductor substrate 12 such as a CZ substrate is prepared, and the electronic shutter adjusting layer 14 is formed by performing ion implantation with N-type impurities of heavy concentration at a position above the semiconductor substrate 12.

Figure 4B:
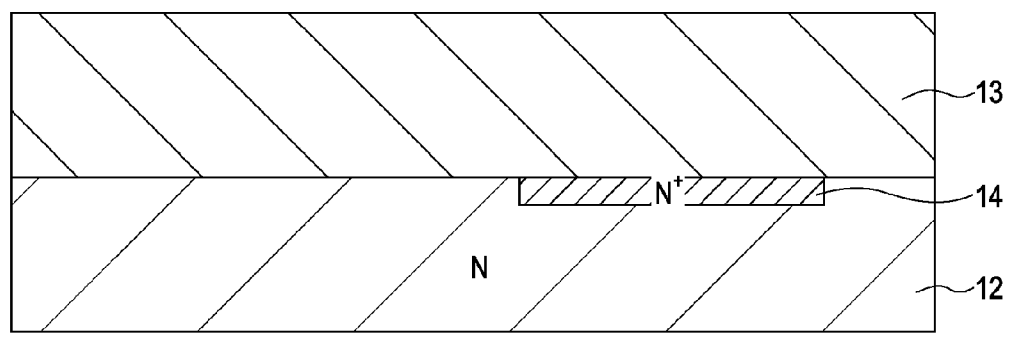

Next, as shown in FIG. 4B, the semiconductor well layer 13 formed of a P-type epitaxial growth layer is formed by using the epitaxial growth method.

Figure 4C:
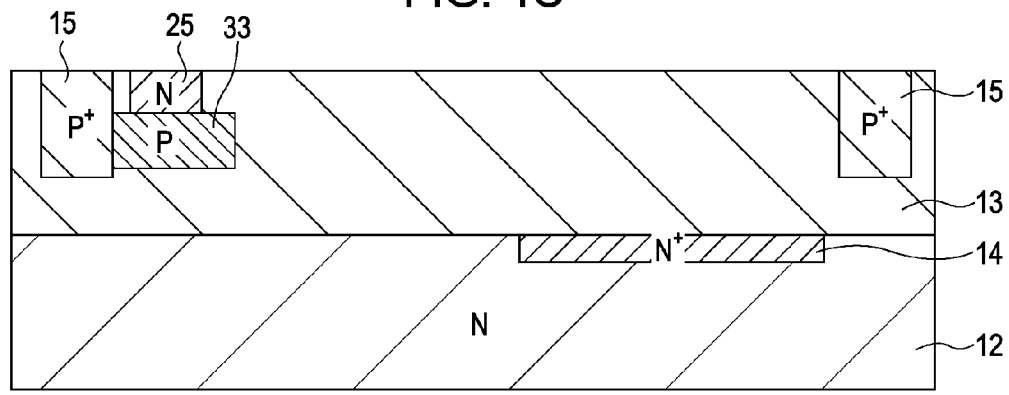

Next, as shown in FIG. 4C, the transferring portion semiconductor well layer 33 is formed by performing ion implantation of the P-type impurities so as to have a predetermined depth of a region where the vertical transfer register 3 of the semiconductor well layer 13 is formed. A vertical transfer channel 25 is formed by performing ion implantation of the N-type impurities in a predetermined region on the transferring portion semiconductor well layer 33. In addition, a channel stop portion 15 is formed by performing ion implantation of the P-type impurities in a region adjacent to the vertical transfer channel 25.

Figure 5D:
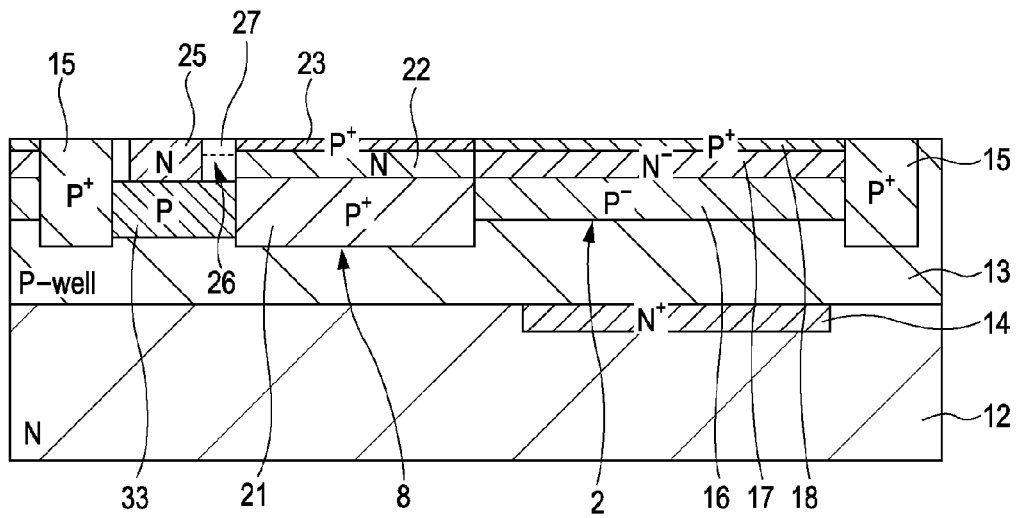
FIGS. 5D and 5E are diagrams illustrating a manufacturing process of the solid-state imaging device according to the first embodiment of the present invention (the second part)

Next, as shown in FIG. 5D, the light receiving portion 2 constituted with the $P^-$ region 16 and the $N^-$ region 17 is formed by performing ion implantation of P-type and N-type impurities at a predetermined position on the surface of the semiconductor well layer 13. In addition, the storage capacitor 8 constituted with $P^+$ region 21 and N region 22 is formed by performing ion implantations of P-type impurities with heavy concentration and N-type impurities at a predetermined position on the surface of the semiconductor well layer 13. Moreover, the first and second dark current suppressing portions 18 and 23 are formed by performing ion implantation of the P-type impurities with heavy concentration on the outermost surface of the semiconductor well layer 13 in the region where the storage capacitor 8 and the light receiving portion 2 are formed. Furthermore, the region between the region where the storage capacitor 8 is formed and the region where the vertical transfer channel 25 is formed is assumed to be a readout channel 27 constituting the readout gate portion 26.

Figure 5E:
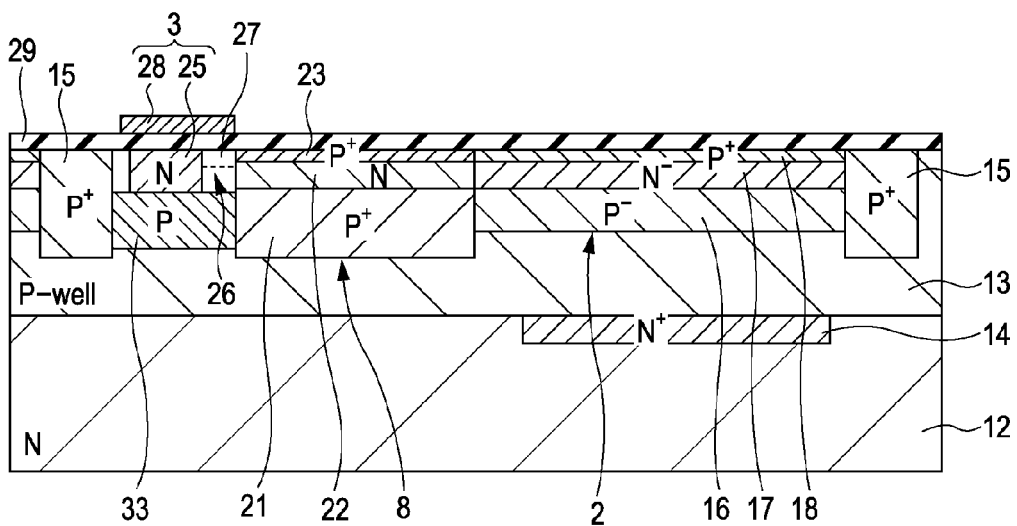

Next, as shown in FIG. 5E, the gate insulating film 29 is formed above the semiconductor well layer 13, and the vertical transfer electrode 28 is formed on the gate insulating film 29. A plurality of vertical transfer electrodes 28 are formed above the vertical transfer channel 25 in the horizontal direction. Furthermore, as shown in FIG. 5E, the vertical transfer electrode 28 above the vertical transfer channel 25 adjacent to the readout channel 27 is formed so as to extend to above the readout channel 27. Accordingly, the vertical transfer electrode 28 also serves as a readout electrode 28a.

After the formation of the electrodes, the light shielding layer 31 is formed in a region except for the light receiving portion 2 via the interlayer insulating film 30 interposed, and thereby the solid-state imaging device 1 is formed as shown in FIG. 2. The light shielding layer 31 may serve as a wiring layer.

Subsequently, the wiring layer, or the same layer as a typical solid-state imaging device such as a flat film, a color filter, and an on-chip lens is formed on the upper layer of the light shielding layer 31, and thereby the solid-state imaging device 1 according to the present embodiment is completed.

In the present embodiment, the semiconductor well layer 13 is constituted with the P⁻-type epitaxial growth layer, but may be constituted with the N⁻-type epitaxial growth layer. In that case, a P well (corresponding to the semiconductor well layer 13) is formed by performing ion implantation of P-type impurities in the N-type epitaxial growth layer so as to include a plurality of pixels 7 arranged in a matrix form. Moreover, it is necessary to configure the profile of the P⁻ region constituting the light receiving portion 2 different from that of the present embodiment for the reason of functional realization.

The electronic shutter adjusting layer 14 may be formed by performing ion implantation of N-type impurities with heavy concentration at high energy after the formation of the semiconductor well layer 13. In addition, in the present embodiment, the electronic shutter adjusting layer 14 is formed to be embedded in the semiconductor substrate 12 side, but may be formed to contact with the semiconductor substrate 12.

In the present embodiment, it is exemplified that the first and second dark current suppressing portions 18 and 23 are formed at one time, but may be formed separately, and may be formed after the vertical transfer electrode 28 is formed.

In the present embodiment, it is exemplified that the gate insulating film 29 is formed over the entire semiconductor well layer 13, but the gate insulating film 29 above the vertical transfer channel 25 and the readout channel 27 may be formed separately from other insulating layers formed above the light receiving portion 2 and the storage capacitor 8.

The light receiving portion 2 or the storage capacitor 8 may be formed after the process shown in FIG. 5E.

[1.4 The Driving Method of the Solid-State Imaging Device]

Next, the driving method of the solid-state imaging device 1 according to the present embodiment will be described. Prior to the description of actual driving in the solid-state imaging device 1 according to the present embodiment, first, the principle of generating and accumulating signal charges in the light receiving portion 2 and the storage capacitor 8 will be described with reference to FIG. 3.

As shown in FIG. 3, when the substrate voltage Vsub is set to be low, the potential Val along the line A-A' has the potential in the N⁻ region 17 deeper than that in the P⁻ region 16 or the semiconductor well layer 13. When the substrate voltage Vsub is low, the potential along the line B-B' also becomes the same as the potential Val along the line A-A'. In addition, the potential Vc along the line C-C' has the well of potential deeper than that in the light receiving portion 2 due to the influence of the junction plane between the N-type region 22 and the P⁺ region 21 constituting the storage capacitor 8.

For that reason, the signal charges generated in the light receiving portion 2 when the substrate voltage Vsub is set to be low are not stored in the light receiving portion 2, but uninterruptedly transferred to the storage capacitor 8, and stored and held in the storage capacitor 8.

Next, when the substrate voltage Vsub is set to be high, the potential Vah along the line A-A' tends to be deeper overall because the electronic shutter adjusting layer 14 is formed of the N-type heavily-doped region. Furthermore, since the electronic shutter adjusting layer 14 is not formed on the line B-B', the potential Vbh around the light receiving portion does not change into the low substrate voltage Vsub only with a little deeper potential in the semiconductor substrate 12 side.

For that reason, when the substrate voltage Vsub is set to be high, the signal charges generated in the light receiving portion 2 is formed to have the potential Vah along the line A-A' deeper than the potential Vbh along the line B-B', and therefore, the signal charges are not transferred to the storage capacitor 8. In addition, the potential Vah along the line A-A' becomes deeper toward the semiconductor substrate 12 side because a barrier of the P-type semiconductor well layer 13 is pressed down by the influence of the electronic shutter adjusting layer 14. As a result, the signal charges generated in the light receiving portion 19 are swept to the semiconductor substrate 12 side. In other words, when the substrate voltage Vsub is set to be high, the signal charges subjected to photoelectric conversion in the light receiving portion 2 do not flow into the storage capacitor 8, but are swept to the semiconductor substrate 12 side.

Furthermore, at that point, among the potential Vbh along the line B-B', the potential around the light receiving portion 2 maintains the value close to that when the substrate voltage Vsub is low due to the influence of the offset region 24. Accordingly, the signal charges stored and held in the storage capacitor 20 do not flow back to the light receiving portion 19 side. In addition, in this way, the signal charges stored in the storage capacitor 8 can maintain the amount of signal charges to around a position in the light receiving portion 2 having the shallow potential Vc even if the substrate voltage Vsub is high.

Based on the afore-mentioned the principle of generating and accumulating the signal charges, the driving method of the solid-state imaging device according to the present embodiment will be described with reference to FIGS. 6A and 6B and FIGS. 7C and 7D. FIGS. 6A and 6B and FIGS. 7C and 7D schematically show the well of potential for one pixel in the light receiving portion 2, the storage capacitor 8, the readout gate portion 26, and the vertical transfer register 3, and the appearance of transferring the signal charges. Components in FIGS. 6A and 6B and FIGS. 7C and 7D corresponding to those in FIG. 2 are given the same reference numerals and overlapping description thereof will not be repeated.

First, the description will be given for the case where the substrate voltage Vsub is low. With the configuration, the generation and accumulation of the signal charges starts at the same time for all pixels. Hereinafter, the period when the operation is performed is referred to as a "light receiving period".

Figure 6A:
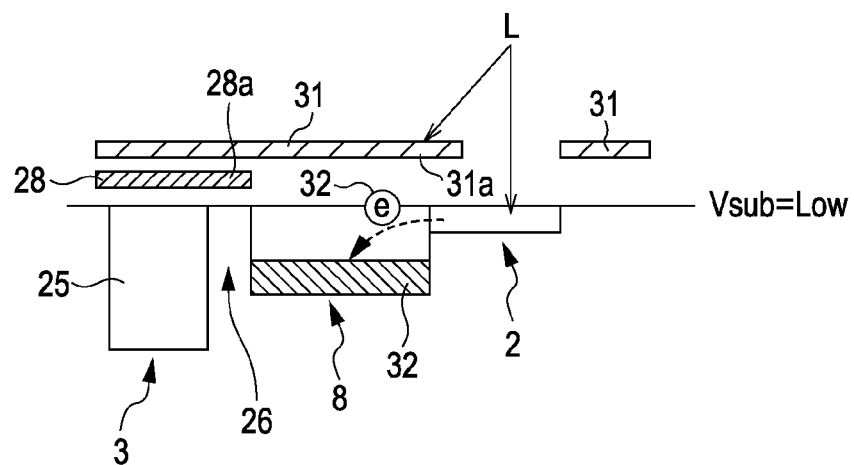
FIGS. 6A and 6B are diagrams illustrating the appearance of signal charges transferring during the driving of the solid-state imaging device according to the first embodiment of the present invention (the first part)

As shown in FIG. 6A, during the light receiving period, the signal charges 32 generated with light L incident on the light receiving portion 2 and photoelectrically converted are uninterruptedly stored and held in the storage capacitor 8 because the substrate voltage Vsub is low. Accordingly, in the all pixels of the solid-state imaging device 1, the signal charges 32 photoelectrically converted in the light receiving portion 2 at the same time are stored and held in the storage capacitor 8.

Furthermore, during the light receiving period, when the strong and excessive amount of light is incident on the light receiving portion, the signal charges 32 generated by the excessive amount of light are swept to the semiconductor substrate 12 side.

Figure 6B:
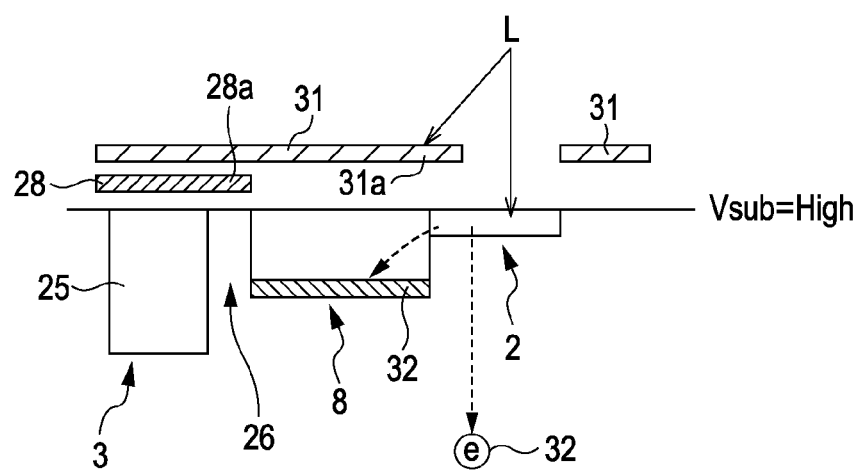

Next, as shown in FIG. 6B, the description will be given for the case where the substrate voltage is high. With the configuration, the accumulation of the signal charges 32 is terminated for the all pixels at the same time, and the readout and transfer of the signal charges are carried out. Hereinafter, the period when the operation is performed is referred to as a "transferring period (no-light receiving period)".

As shown in FIG. 6B, during the transferring period, the signal charges 32 generated with light L incident on the light receiving portion 2 and photoelectrically converted are swept to the semiconductor substrate 12 side and not transferred to the storage capacitor 8 because the substrate voltage Vsub is high. In other words, the high substrate voltage terminates the light receiving period for the all pixels at the same time.

Figure 7C:
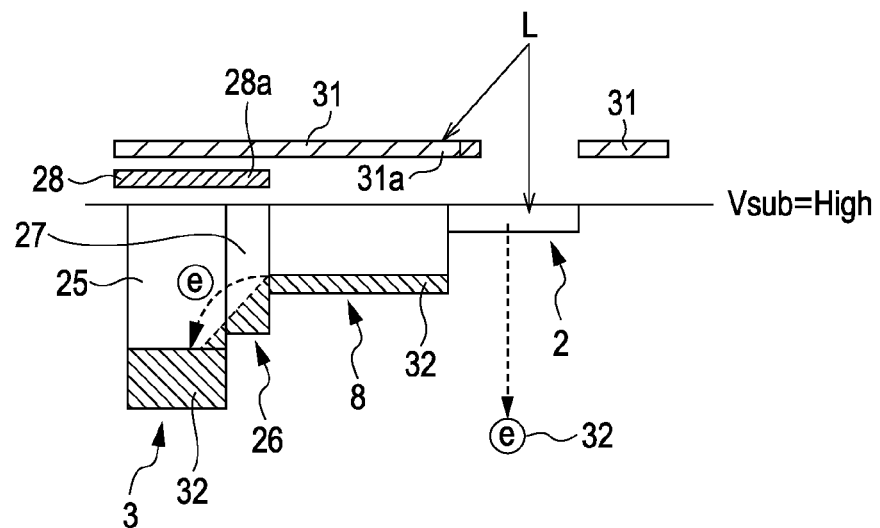
FIGS. 7C and 7D are diagrams illustrating the appearance of signal charges transferring during the driving of the solid-state imaging device according to the first embodiment of the present invention (the second part)

Subsequently, as shown in FIG. 7C, the signal charges 32 stored and held in the storage capacitor 8 are read out in the vertical transfer channel by applying a readout voltage to the vertical transfer electrode 28 that also serves as the readout electrode 28a. The readout operation of the signal charges 32 from the storage capacitor 8 employs the same interlaced scan method as the readout operation of the signal charges from the light receiving portion in the general CCD imaging device. For example, the interlaced scan is performed for every two lines, every three lines or every four lines. The signal charges in a pixel of a line waiting for being read out are held until the signal charges are read out in the storage capacitor.

Figure 7D:
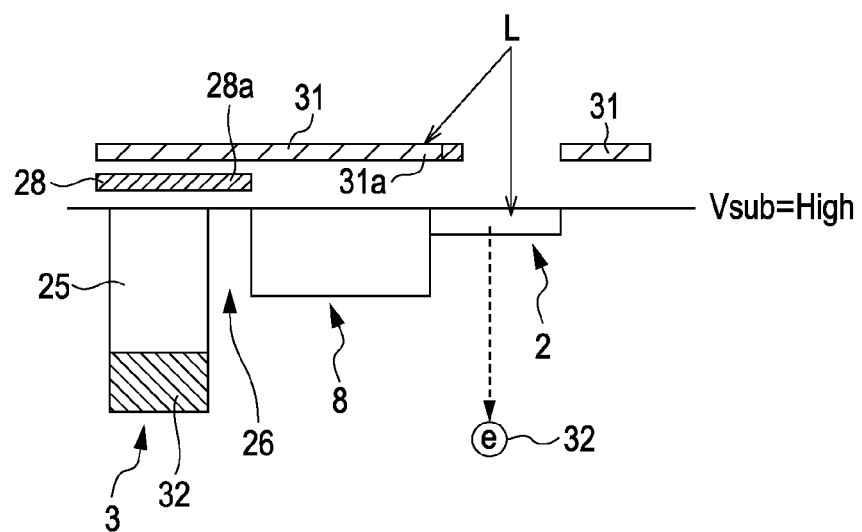

Furthermore, as shown in FIG. 7D, the signal charges 32 read out in the vertical transfer channel 25 are transferred in the vertical direction by applying, for example, a 4-phase transferring pulse to the vertical transfer electrode 28. The readout and transfer of the signal charges 32 from the storage capacitor 8 employs the same interlaced scan scheme as the readout and transfer of signal charges from the light receiving portion in the general CCD imaging device.

For example, when 1:2 interlaced scan scheme is used, the signal charges in the pixels of 2N+1 (N=0, 1, 2, 3 . . . ) lines are read out and transferred. Then, the signal charges in the pixels of 2N (N=0, 1, 2, 3 . . . ) lines are read out and transferred in the next field. As such, in the 1:2 interlaced scan scheme, the signal charges in the all pixels are read out and transferred for 2 times.

Similarly, when 1:3 interlaced scan scheme is used, the signal charges in the pixels of 3N+1 (N=0, 1, 2, 3 . . . ) lines are read out and transferred in the first field. Successively, the signal charges in the pixels of 3N+2 (N=0, 1, 2, 3 . . . ) lines are read out and transferred in the second field, and then the signal charges in the pixels of 3N+3 (N=0, 1, 2, 3 . . . ) lines are read out and transferred in the third field. As such, in the 1:3 interlaced scan scheme, the signal charges in the all pixels are read out and transferred for 3 times.

As such, with the division of the readout operation into several times, the signal charges 32 for each line can increase the number of transferring stages that can be used during vertical transfer, and thereby it is possible to increase the amount of charge to be treated in the vertical transfer register 3.

In the present embodiment, the light receiving portion 2 successively generates the signal charges even during the transferring period as above, but the substrate voltage Vsub is high, and thereby the signal charges photoelectrically converted during the transferring period are swept to the semiconductor substrate 12 side at any time.

After that, the signal charges 32 transferred in the vertical direction by the vertical transfer register 3 are transferred in the horizontal direction by the horizontal transfer register 4, and output as video signals through the output circuit 5.

As such, in the solid-state imaging device 1 according to the present embodiment, with changes in the substrate voltage Vsub, the signal charges 32 generated in the light receiving portion 2 during the light receiving period are uninterruptedly transferred to the storage capacitor 8, and the signal charges generated in the light receiving portion 2 during the transferring period are swept to the substrate side. In other words, only with the changes in the substrate voltage Vsub due to the influence of the electronic shutter adjusting layer 14 and the offset region 24, an electronic shutter function can be obtained. Accordingly, the CCD imaging device can be obtained that employs non-progressive scan method (the interlaced scan method in the present embodiment), and can be applied to electronic apparatus without a shutter outside the device such as a mechanical shutter.

Furthermore, as shown in FIG. 6A, since the signal charges 32 generated in the light receiving portion 2 are uninterruptedly transferred to the storage capacitor 8, any transferring electrodes between the light receiving portion 2 and the storage capacitor 8 are not necessary, and thereby the structure becomes simple. For that reason, an opening of the light receiving portion 2 or the area of the storage capacitor 8 can be increased, and the sensitivity or dynamic range can be increased. Moreover, since there are no transferring electrode between the light receiving portion 2 and the storage capacitor 8, and the substrate interface formed of silicon is not depleted during the transfer of the signal charges, the increase in dark current can be suppressed.

Furthermore, since the light receiving portion 2 has a spectral sensitivity characteristic, there is no necessity to extend a depleted layer, and it is easy to set a position with deep electrostatic potential to a position deep from the substrate surface. However, since the storage capacitor 8 is specialized in accumulating and storing signal charges, it is possible to set a position with the shallowest electrostatic potential to a position shallow from the substrate surface, and thereby the readout voltage can be easily lowered.

Furthermore, in the solid-state imaging device of the related art, the generation and accumulation of the signal charges are performed in the light receiving portion. However, according to the solid-state imaging device 1 of the present embodiment, since the accumulation of the signal charges is not performed in the light receiving portion 2, it is possible to form the electrostatic potential of the light receiving portion 2 shallower by several volts than the electrostatic potential of the light receiving portion that performs the accumulation as in the past. Accordingly, it is possible to reduce electric field of the light receiving portion 2. Therefore, it is possible to reduce the dark current resulting from the electric field.

Furthermore, in the solid-state imaging device 1 according to the present embodiment, the first and second dark current suppressing portions 18 and 23 having the HAD structure are formed in the light receiving portion 2 and the storage capacitor 8, and the surface is filled with holes. For that reason, the dark current generated from silicon constituting the substrate or oxide film interface constituting the gate insulating film 29 can be suppressed.

Furthermore, according to the present embodiment, the storage capacitor 8 is shielded by the light shielding layer 31. Accordingly, as shown in FIGS. 6A and 6B and FIGS. 7C and 7D, the light L is prevented from being transferred the storage capacitor 8 and photoelectrically converted during the light receiving period and even before and after the light reception.

Furthermore, according to the present embodiment, the light shielding layer 31 is formed so as to have a protruding portion 31a from the storage capacitor 8 to the light receiving portion 2 side. For that reason, even after the substrate voltage Vsub becomes high and the light receiving period ends, light incident around the storage capacitor 8 in the incident light L is suppressed to be incorporated into the storage capacitor 8 as a kind of smear.

Furthermore, according to the present embodiment, by having the P+ region 21 with relatively heavy concentration below the N-type region 22 constituting the storage capacitor 8 as shown in FIG. 2, the capacity of the depleted layer formed in the junction plane between the N region 22 and the P+ region 21 can be increased. Accordingly, the incorporation of smear into the storage capacitor 8 can be suppressed.

<2. Second Embodiment>

Figure 8:
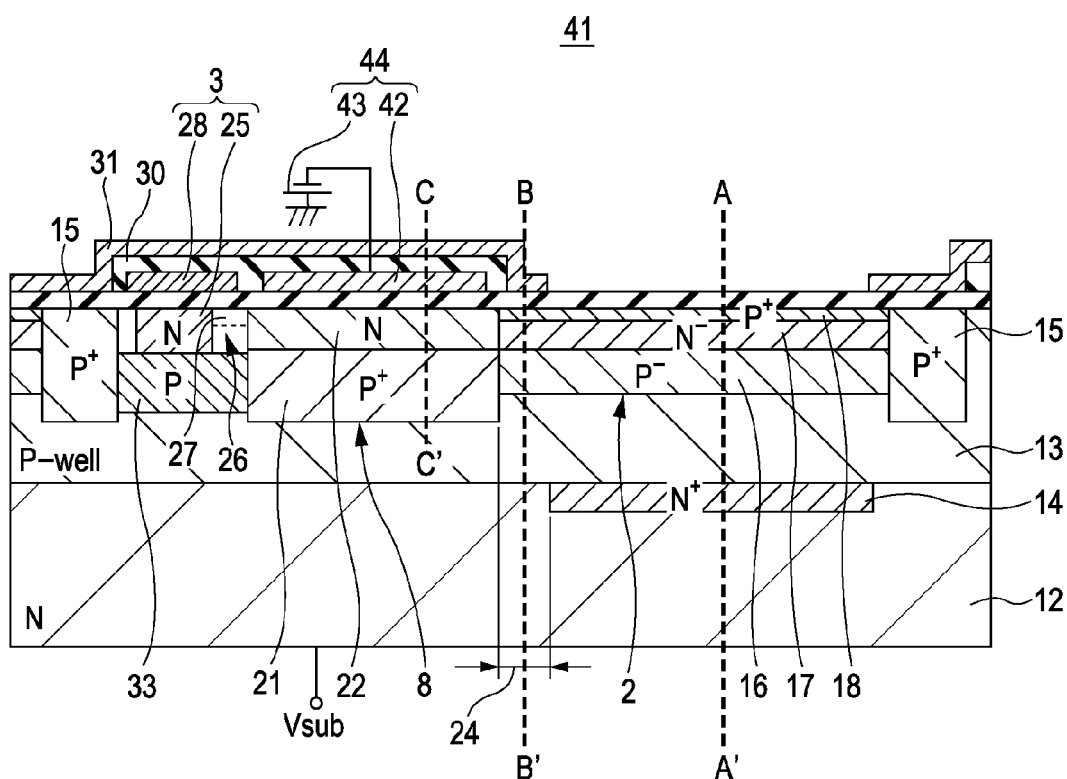
FIG. 8 is a schematic cross-sectional diagram illustrating a solid-state imaging device according to a second embodiment of the present invention.

FIG. 8 is a schematic cross-sectional diagram illustrating the structure of the solid-state imaging device according to a second embodiment of the present invention. Components in FIG. 8 corresponding to those in FIG. 2 are given the same reference numerals and overlapping description thereof will not be repeated.

A solid-state imaging device 41 of the present embodiment is an example with partially modified structure of the second dark current suppressing portion of the solid-state imaging device in the first embodiment.

In the present embodiment, the second dark current suppressing portion 44 in the storage capacitor 8 is constituted with a dark current suppressing electrode 42 and a DC voltage supply 43. The dark current suppressing electrode 42 is formed above the storage capacitor 8 of the semiconductor well layer 13 via the gate insulating film 29 interposed therebetween.

In the solid-state imaging device 41, potential along the line A-A', B-B', and C-C' in FIG. 8 has the same profile as that in FIG. 3 described in the first embodiment.

Furthermore, the second dark current suppressing portion 44 in the solid-state imaging device 41 can be formed by forming the dark current suppressing portion 42 in the process shown in FIG. 8, without the formation of the second dark current suppressing portion 23 in the process shown in FIG. 5E according to the manufacturing method presented in the first embodiment.

In the solid-state imaging device 41 according to the present embodiment, negative bias voltage is applied to the dark current suppressing electrode 42, and thereby the surface of the N region 22 constituting the storage capacitor 8 is inverted and filled with holes. Accordingly, the dark current generated at the interface of the storage capacitor 8 is reduced in the presence of the holes, and thereby the dark current in the storage capacitor 8 can be suppressed.

The sold-state imaging device 41 of the present embodiment can be driven by the same driving method of the solid-state imaging device 1 according to the first embodiment. In the present embodiment, it is also possible to obtain the CCD imaging device that con be applied to electronic apparatus employing non-progressive scan method (the interlaced scan method in the present embodiment) and without a shutter outside of the body such as a mechanical shutter. In addition, it is possible to obtain the same effect as in the first embodiment. Moreover, the dark current suppressing electrode 42 and the light shielding layer 31 may be electronically connected to each other in a pixel portion and then connected to the DC voltage supply 43.

In the first and second embodiment described above, the first conductivity type is referred to as the N-type and the second conductivity type as the P-type, but the first conductivity type may be referred to as the P-type and the second conductivity type as the N-type. In that case, a predetermined pulse applied to the solid-state imaging device may have a reversed polarity opposite to the example above.

The present invention is not limited to the application to a solid-state imaging device, but possible to the application to any imaging devices. Here, the imaging devices refer to any electronic apparatus having a capturing function such as camera systems including digital still cameras, video cameras, or the like, or mobile phones. Furthermore, a device with the module mounted in electronic apparatus, namely a camera module, may be assumed to be such an imaging device.

Hereinafter, electronic apparatus using the solid-state imaging device of the embodiment of the present invention will be described.

<3. Third Embodiment>

Figure 9:
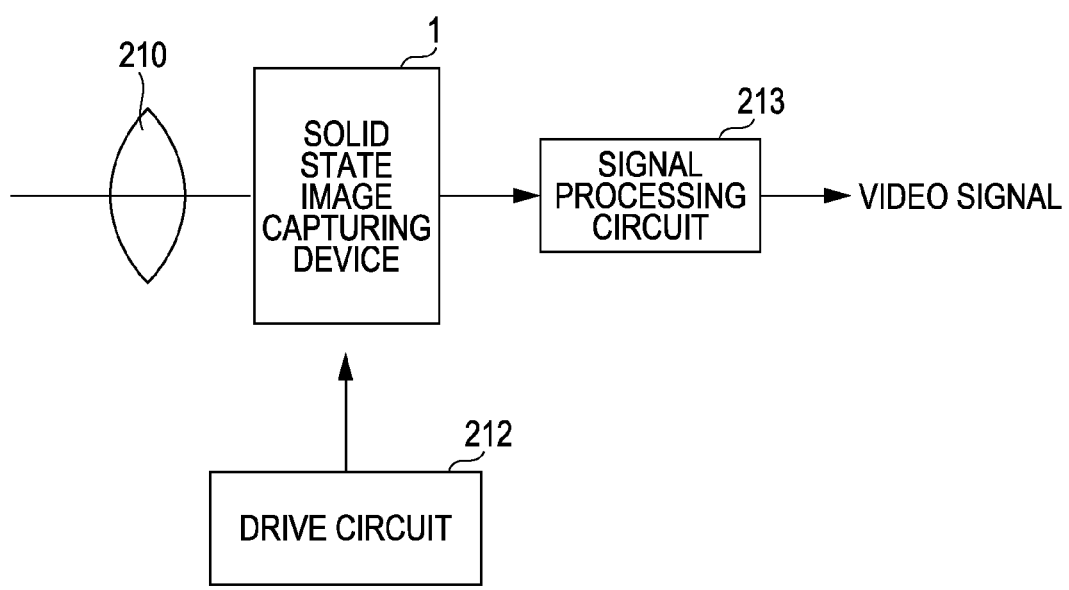
FIG. 9 is a schematic diagram illustrating a configuration of electronic apparatus according to a third embodiment of the present invention.

FIG. 9 shows an embodiment of schematic configuration of electronic apparatus 200 according to a third embodiment of the present invention.

The electronic apparatus 200 of the present embodiment represents an embodiment in which the solid-state imaging device 1 in the aforementioned first embodiment of the present invention is used in a camera.

In FIG. 9, the schematic cross-sectional configuration of the electronic apparatus 200 according to the present embodiment is shown. The electronic apparatus 200 of the present embodiment is an example of a digital still camera that can capture still images.

The electronic apparatus 200 according the present embodiment includes the solid-state imaging device 1, an optical lens 210, a driving circuit 212, and a signal processing circuit 213.

The optical lens 210 causes image light (incident light) from an object to form an image on an imaging area of the solid-state imaging device 1. Accordingly, signal charges are stored in the solid-state imaging device 1 for a certain period of time.

The driving circuit 212 supplies transferring operation signal of the solid-state imaging device 1. Driving signals (timing signals) supplied from the driving circuit 212 performs transferring of the signals of the solid-state imaging device 1. The signal processing circuit 213 performs various kinds of signal processing. Video signals subjected to the signal processing are stored in a storing medium such as a memory or output to a monitor.

In the electronic apparatus 200 according the present embodiment, since the solid-state imaging device has the electronic shutter function, it is not necessary to provide an optical shutter such as a mechanical shutter in addition to the solid-state imaging device. For that reason, the electronic apparatus can be manufactured at a low cost, and a small-sized and light-weighted electronic apparatus can be realized. Furthermore, the solid-state imaging device used in the electronic apparatus of the present embodiment achieves the suppression of the dark current and the improvement of sensitivity, and thereby achieving the improvement of image quality.

An electronic apparatus that can be applied with the solid-state imaging device 1 is not limited to a digital still camera, but may be applied with any imaging device such as a camera module for a mobile apparatus including a mobile phone.

In the present embodiment, the solid-state imaging device 1 is used in the electronic apparatus, but the solid-state imaging device according to the second embodiment may be used.

The present application contains subject matter related to that disclosed in Japanese Priority Patent Application JP 2009-025346 filed in the Japan Patent Office on Feb. 5, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising:
a substrate;
a substrate voltage supply that applies a first potential to the substrate during a light receiving period and applies a second potential to the substrate during a no-light receiving period; and
a plurality of pixels each including
a light receiving portion that is on a surface of the substrate and generates signal charges in response to received light,
a storage capacitor that is adjacent to the light receiving portion and stores and holds the signal charges generated in and transferred from the light receiving portion when the first potential is applied to the substrate,
a dark current suppressing portion that is on the light receiving portion and the storage capacitor,
an electronic shutter adjusting layer that is formed in a region facing the light receiving portion in the substrate and set apart from the storage capacitor as far as a predetermined offset region and adjusts potential distribution in the substrate so that the signal charges generated in the light receiving portion when the second potential is applied to the substrate are swept to a rear surface side of the substrate,
a readout gate portion that reads out the signal charges stored in the storage capacitor, and
a vertical transfer register that transfers the signal charges read out by the readout gate portion in a vertical direction.

2. The solid-state imaging device according to claim 1, wherein;
the substrate includes a first conductivity type semiconductor substrate and a second conductivity type semiconductor well layer on the semiconductor substrate;
the light receiving portion is on the second conductivity type semiconductor well layer and has junction planes between a first conductivity type impurity region and a dark current suppressing portion thereon and between the first conductivity type impurity region and a second conductivity type impurity region;
the storage capacitor includes a junction plane between a first conductivity type impurity region and a second conductivity type impurity region; and
the electronic shutter adjusting layer is formed of the first conductivity type impurity region between the first conductivity type semiconductor substrate and the second conductivity type semiconductor well layer.

3. The solid-state imaging device according to claim 2, wherein an electrostatic potential of the storage capacitor is formed to be deeper than an electrostatic potential of the light receiving portion.

4. The solid-state imaging device according to claim 3, wherein an electrostatic potential in a region between the light receiving portion and the storage capacitor, which is above the predetermined offset region, maintains substantially same value during both of the light receiving period and the no-light receiving period.

5. The solid-state imaging device according to claim 4, comprising a light shielding layer above the storage capacitor on a light incidence side, an end of the light shielding layer extending to the light receiving portion side so as to have a protruding portion.

6. The solid-state imaging device according to claim 5, wherein dark current suppressing portions of the light receiving portion and the storage capacitor include a second conductivity type impurity region formed on surfaces of the light receiving portion and the storage capacitor on the light incidence side.

7. The solid-state imaging device according to claim 5, wherein:
the dark current suppressing portion of the light receiving portion includes the second conductivity type impurity region formed on the surface of the light receiving portion on the light incidence side; and
the dark current suppressing portion of the storage capacitor includes a dark current suppressing electrode formed on the storage capacitor on the light incidence side and a DC voltage supply that applies a DC voltage to the dark current suppressing electrode.

8. The solid-state imaging device according to claim 7, wherein the dark current suppressing electrode is electrically connected to the light shielding layer.

9. The solid-state imaging device according to claim 5, wherein the light shielding layer is also formed above the vertical transfer register.

10. The solid-state imaging device according to claim 5, wherein the light shielding layer is formed so as to cover a region except for an opening region of the light receiving portion.

11. A driving method of a solid-state imaging device that includes (i) a substrate, (ii) a substrate voltage supply that applies a first potential to the substrate during a light receiving period and applies a second potential to the substrate during no-light receiving period and, (iii) a plurality of pixels each including (a) a light receiving portion that is on a surface of the substrate and generates signal charges in response to received light, (b) a storage capacitor that is adjacent to the light receiving portion and stores and holds the signal charges generated in and transferred from the light receiving portion when the first potential is applied to the substrate, (c) a dark current suppressing portion that is on the light receiving portion and the storage capacitor, (d) an electronic shutter adjusting layer that is in a region facing the light receiving portion in the substrate and set apart from the storage capacitor as far as a predetermined offset region and adjusts potential distribution in the substrate so that the signal charges generated in the light receiving portion when the second potential is applied to the substrate are swept to a rear surface side of the substrate, (e) a readout gate portion that reads out the signal charges stored in the storage capacitor, and (f) a vertical transfer register that transfers the signal charges read out by the readout gate portion in a vertical direction, the method comprising the steps of:
initiating a transfer of the signal charges generated in the light receiving portion to the storage capacitor with an application of the first potential by the substrate voltage supply to the substrate; and
terminating the transfer of the signal charges generated in the light receiving portion to the storage capacitor with an application of the second potential by the substrate voltage supply to the substrate, sweeping the signal charges generated in the light receiving portion to the substrate side, and reading out the signal charges stored in the storage capacitor.

12. The driving method of a solid-state imaging device according to claim 11, wherein:
the initiation and the termination of the light receiving period occur at the same time in light receiving portions of all of the pixels formed on the substrate, and the readout of the signal charges from the storage capacitor is performed for each pixel in order during the no-light receiving period.

13. An electronic apparatus comprising:

an optical lens;

a solid-state imaging device incident with light condensed on the optical lens, the solid-state imaging device including (i) a substrate, (ii) a substrate voltage supply that applies a first potential to the substrate during a light receiving period and applies a second potential to the substrate during a no-light receiving period, and (iii) a plurality of pixels each including (a) a light receiving portion that is on a surface of the substrate and generates signal charges in response to received light, (b) storage capacitor that is adjacent to the light receiving portion and stores and holds the signal charges generated in and transferred from the light receiving portion when the first potential is applied to the substrate, (c) a dark current suppressing portion that is on the light receiving portion and the storage capacitor, (d) an electronic shutter adjusting layer that is in a region that is facing the light receiving portion in the substrate and set apart from the storage capacitor as far as a predetermined offset region and adjusts potential distribution in the substrate so that signal charges generated in the light receiving portion when the second potential is applied to the substrate are swept to a rear surface side of the substrate, (e) a readout gate portion that reads out signal charges stored in the storage capacitor, and (f) a vertical transfer register that transfers signal charges read out by the readout gate portion in a vertical direction; and a signal processing circuit that processes an output signal from the solid-state imaging device.

* * * * *